United States Patent [19]
Dietz

[11] 4,234,826
[45] Nov. 18, 1980

[54] SYNCHRONOUS SWITCHED VERTICAL DEFLECTION DRIVEN DURING BOTH TRACE AND RETRACE INTERVALS

[75] Inventor: Wolfgang F. W. Dietz, New Hope, Pa.

[73] Assignee: RCA Corporation, New York, N.Y.

[21] Appl. No.: 52,784

[22] Filed: Jun. 28, 1979

[51] Int. Cl.³ .............................................. H01J 29/72
[52] U.S. Cl. ...................................... 315/393; 315/408
[58] Field of Search ................ 315/399, 408, 393, 395

[56] References Cited
U.S. PATENT DOCUMENTS
4,048,544  9/1977  Haferl .................................. 315/408

OTHER PUBLICATIONS
P. Schulz, *SMVD–A New Vertical Deflection Circuit for Television Receivers*, Standard Electrik Lorenz, Mar. 29, 1977.

*Primary Examiner*—Theodore M. Blum
*Attorney, Agent, or Firm*—Eugene M. Whitacre; Paul J. Rasmussen; Joseph J. Laks

[57] ABSTRACT

A television synchronous switched vertical deflection circuit couples energy from horizontal deflection circuit to a vertical deflection winding by means of a pair of controllable switches to form the vertical deflection current. One switch of the pair couples energy during the horizontal retrace interval and the other couples energy during the horizontal trace interval.

17 Claims, 9 Drawing Figures

SYNCHRONOUS SWITCHED VERTICAL DEFLECTION DRIVEN DURING BOTH TRACE AND RETRACE INTERVALS

BACKGROUND OF THE INVENTION

This invention relates to synchronous switched vertical deflection (SSVD) for television display arrangements in which energy for generating the vertical deflection current is extracted from the horizontal deflection circuit during both the horizontal trace and retrace intervals.

U.S. Pat. No. 4,048,544 issued Sept. 13, 1977 to P. Haferl describes an SSVD system in which energy is extracted from the horizontal deflection generator during the horizontal retrace interval. In the Haferl arrangement, a first winding coupled to the horizontal deflection generator is coupled in series with a controllable switch in the form of an SCR and an inductor to charge a capacitor in a first polarity for driving current in one direction through the vertical deflection winding. A second series arrangement of an SCR, a winding and an inductor is coupled to the capacitor for charging it in a second polarity for driving current in the opposite direction through the vertical deflection winding.

The energy coupled through one of the series charging paths in an SSVD arrangement is highly sensitive to the time at which the SCR is gated into conduction. Immediately before the end of the horizontal retrace interval, the retrace pulse voltage is small, and a relatively small current flows in the path with correspondingly small energy transfer. Advancing the gating time not only increases the time during which current may increase in the charging inductor, but also increases the peak magnitude of that portion of the retrace pulse voltage applied to the charging inductor. Thus, small changes in the gating time can result in large changes in the energy coupled from the horizontal deflection generator to the vertical deflection winding. The large voltages and currents and rates of change of voltages and currents involved in the SSVD tends to cause coupling of energy from the power circuits to the control circuit. As a result, the earlier-gated SCR causes large changes in voltages and currents in the power circuit which when coupled to the control circuit by conductors and other coupling paths tends to cause early gating or "pulling" of the latergated SCR. This, in turn, may cause shading of the raster, which is known as "white line" or "black line". The shading results from changes in the velocity of the vertical scan, by which the scanned spot dwells for greater or lesser duration in particular portions of the vertical scan.

It is desirable to eliminate wound components generally and particularly desirable to eliminate windings on the flyback transformer. It is also desirable to reduce shading of the raster resulting from the tendency of the firing of one SCR pull the trigger time of the other.

SUMMARY OF THE INVENTION

A switched vertical deflection arrangement includes a source of voltage alternating at the horizontal deflection rate between mutually opposite first and second polarities. A first controllable switch couples the source with a vertical deflection winding during the horizontal retrace interval for allowing the flow of current of a first polarity through the winding. A second controllable switch couples the source with the winding during the horizontal trace interval for allowing the flow of current through the vertical deflection winding in a second polarity opposite to that of the first. A control circuit is coupled with the first and second switches for controlling their conduction, which controls the amount of current of the first and second polarities flowing in the winding by which the net current through the windings is controlled to establish the vertical deflection current.

DESCRIPTION OF THE INVENTION

Figure 1:
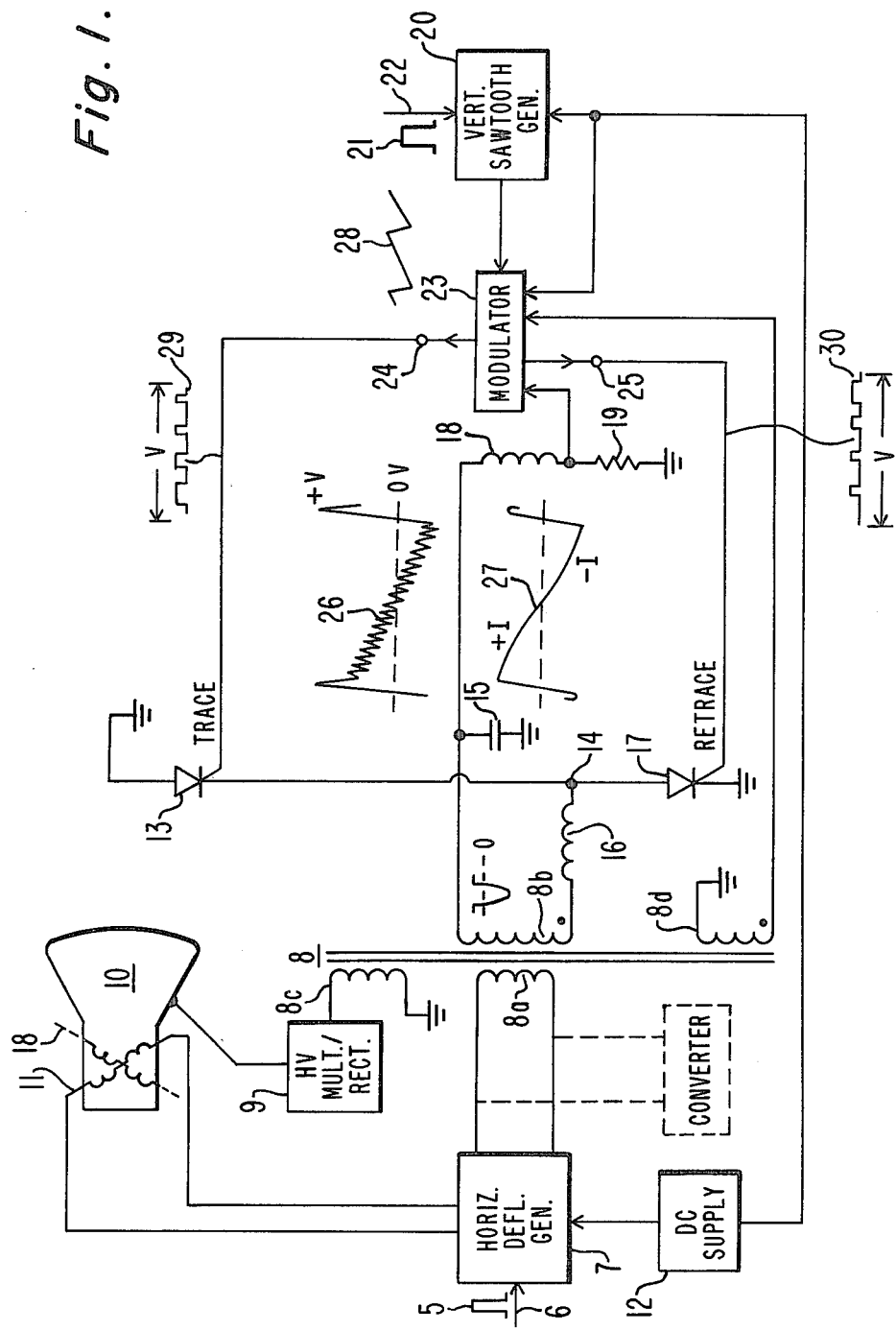
FIG. 1 is a diagram in block and schematic form of an embodiment of the invention.

FIG. 1 shows a synchronous switched vertical deflection (SSVD) circuit which may be incorporated in a television receiver. Horizontal sync pulses 5 from a sync separator, not shown, are coupled through an input terminal 6 to a horizontal deflection generator 7. Generator 7 may be of any type suitable for supplying horizontal deflection current to a horizontal deflection winding 11 associated with a cathode ray tube 10 and for supplying horizontal-rate pulses for various timing functions within a television receiver. A primary winding 8a of a horizontal output and high voltage (flyback) transformer 8 receives energy from generator 7. A secondary winding 8c of transformer 8 supplies retrace pulses to a high voltage multiplier and rectifier assembly illustrated as a block 9 which provides a high direct voltage to the ultor of cathode ray tube 10. A secondary winding 8b of transformer 8 has one end coupled to ground by a capacitor 15. The other end of winding 8b is coupled by way of a series inductor 16 to the cathode of a thyristor or SCR 13 and to the anode of an SCR 17 at a circuit point 14. The anode of SCR 13 and the cathode of SCR 17 are connected to ground, whereby thyristors 13 and 17 are effectively antiparalleled. The series combination of a vertical deflection winding 18 and a current sensing resistor 19 is coupled across capacitor 15. A vertical sawtooth generator illustrated as a block 20 responds to vertical synchronizing pulses illustrated as 21 applied to an input terminal 22 to produce at its output a vertical-rate sawtooth voltage illustrated as 26. Sawtooth voltage 26 is applied to a control circuit or modulator illustrated as a block 23. Modulator 23 is coupled to a secondary winding 8d of transformer 8 for receiving horizontal timing information, and receives feedback from current sensing resistor 19. Modulator 23 responds to these inputs and produces a series of gating pulses illustrated as 29 which are coupled to the gate of SCR 13 for triggering SCR 13 during the horizontal trace interval, and also produces a series of gating pulses illustrated as 30 which are coupled to the gate of SCR 17 for triggering SCR 17 during the horizontal retrace interval.

In operation during the horizontal retrace interval, horizontal deflection generator 7 produces at the end of winding 8b adjacent inductor 16 a retrace voltage pulse which is positive with respect to ground, thereby forward-biasing SCR 17, which remains nonconductive until gated into conduction. At some time during the horizontal retrace interval, modulator 23 provides a gating pulse to SCR 17, which is thereby gated into conduction and becomes a low impedance relative to ground. This closes a path for the flow of current through winding 8b, inductor 16, SCR 17 and capacitor 15. Current begins to flow in the circular path, increasing with time as energy from winding 8b is stored in the magnetic field associated with inductor 16. The current flow also stores energy in capacitor 15 and charges the upper plate of capacitor 15 negative with respect to ground. Current continues to increase in the circular path unit a time near the end of the horizontal retrace interval.

Near the end of the horizontal retrace interval, the voltage across winding 8b is reversed from that during the retrace interval, and therefore opposes the flow of current through inductor 16. Due to the energy stored in inductor 16, however, current continues to flow in the circular path through SCR 17, capacitor 15 and winding 8b until the energy stored in the magnetic field is reduced to zero. When the energy stored in inductor 16 reaches zero, current stops flowing in the circular path including SCR 17, the voltage across winding 8b makes the anode of SCR 17 negative with respect to ground, and SCR 17 becomes nonconductive.

After SCR 17 becomes nonconductive during the horizontal trace interval, the voltage across winding 8b appears as a negative voltage applied to the cathode of SCR 13. Thyristor 13 is thereby forward-biased, but remains nonconductive until gated into conduction by a gating pulse produced by modulator 23. During the interval in which both SCRs 13 and 17 are nonconductive, no current flows in winding 8b or inductor 16.

At a later time during the horizontal trace interval, SCR 13 is gated into conduction, thereby closing a circular path by which current can flow through inductor 16, winding 8b and capacitor 15. Current begins to flow in this path, increasing with time as energy is stored in the magnetic field of inductor 16. The current flow is poled to make the upper plate of capacitor 15 positive with respect to ground. Energy continues to increase in the circular path including SCR 13 until a time near the end of the horizontal interval. At this time, the voltage across winding 8b once again reverses polarity and opposes the flow of current in inductor 16. Current continues to flow in the circular path including inductor 16 and SCR 13, however, until the energy stored in inductor 16 is exhausted.

When the energy in inductor 16 is exhausted during the horizontal retrace interval, the current through SCR 13 and inductor 16 decreases to zero and SCR 13 becomes nonconductive. The voltage at the anode of SCR 17 again goes positive, but it remains nonconductive until gated into conduction at a later time during the horizontal retrace interval. The above-described recurrent operation provides capacitor 15 with controllable charging current of two polarities.

Figure 2:
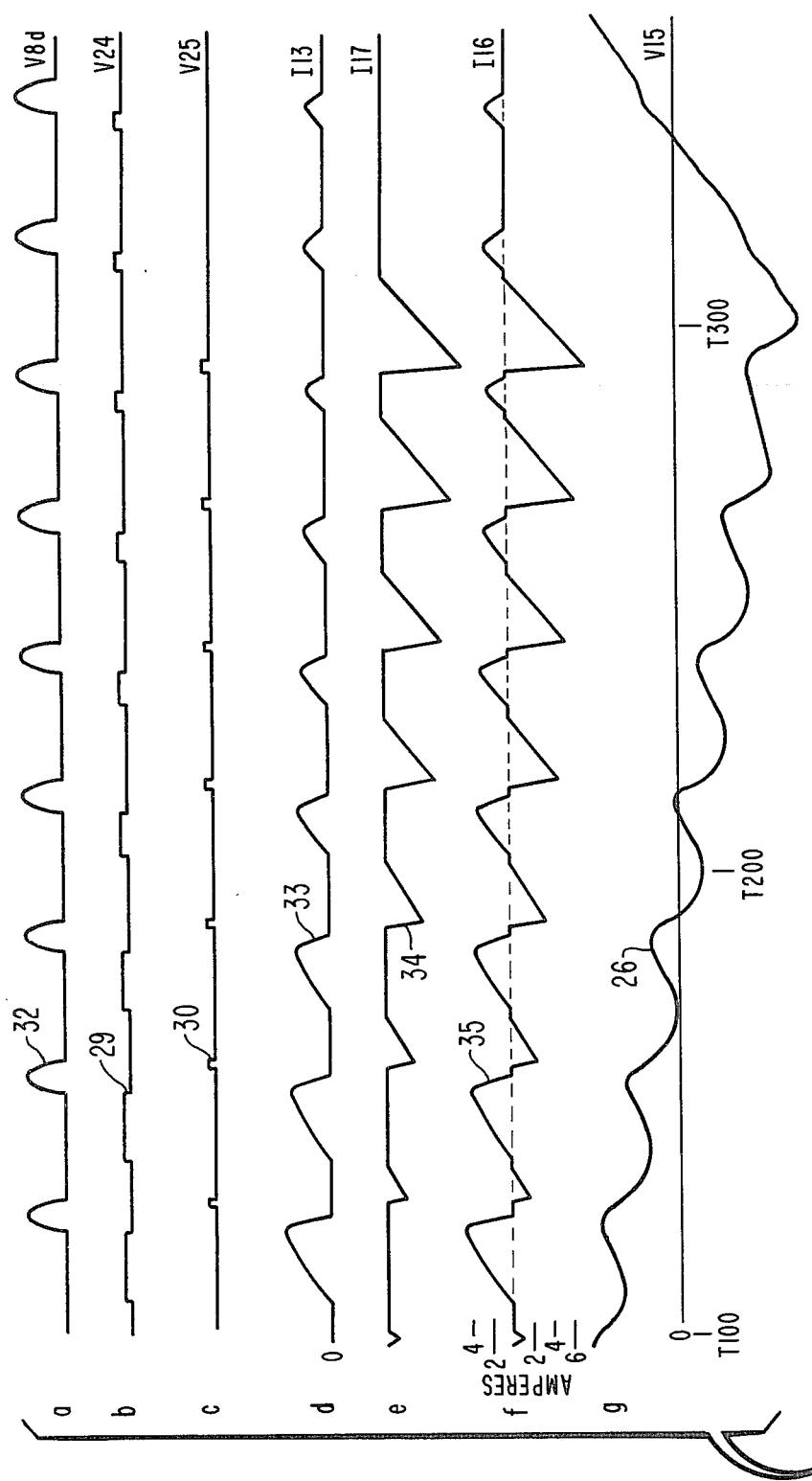
FIG. 2 illustrates as amplitude-time plots certain voltages and currents occurring in the arrangement of FIG. 1 during operation.

In operation near the time T100 of the beginning of the vertical scanning interval, modulator 23 provides gating pulses 29 which, as illustrated in FIG. 2b, have leading edges which occur early during each horizontal trace interval for gating SCR 13 into conduction early during each trace interval. Also near time T100, modulator 23 produces gating pulses 30 as illustrated in FIG. 2c, the leading edges of which occur relatively late during each horizontal retrace interval for late gating of SCR 17. Early gating of SCR 13 allows more time for current to build up in SCR 13, as illustrated by waveform 33 of FIG. 2d, and in the charging path including capacitor 15 and inductor 16, as illustrated by the portions of waveform 35 of FIG. 2c above the zero line. Late gating of SCR 17 allows little time for the charging current to build up to significant levels in SCR 17, as illustrated by 34 of FIG. 2e, and in inductor 16, as illustrated by those portions of waveform 34 below the zero line. Consequently, capacitor 15 receives a relatively large positive charge and a relatively small negative charge during each recurrent horizontal cycle near time T100, and the voltage across capacitor 15 is a relatively large positive voltage with horizontal-rate fluctuations, as illustrated by voltage 26 of FIG. 2g. Modulator 23 progressively gates SCR 13 later during each recurrent horizontal trace interval, and SCR 17 earlier during each recurrent horizontal retrace interval, thereby progressively decreasing the magnitude of current pulses 33 charging capacitor 15 positive, and increasing the magnitude of current pulses 34 charging capacitor 15 negative. This results in a progressively decreasing voltage across capacitor 15 in the interval T100–T200. Near the time T200 of the center of the vertical scanning interval, the integrated positive-and negative-going charging currents 33 and 34 are equal, and the voltage across capacitor 15 approaches zero, and then reverses polarity during the latter half T200–T300 of the scanning interval. Just before the end T300 of the vertical scanning interval, SCR 17 is gated at the earliest gating time during the horizontal retrace interval, and SCR 13 is gated at the latest gating time during the horizontal trace interval, thereby producing a maximum negative voltage across capacitor 150. Deflection winding 18 integrates the voltage 26 across capacitor 15 during the vertical scanning interval to produce a vertical deflection current illustrated as 27 in FIG. 1. Integration of the horizontal-rate fluctuations of voltage 26 applied across deflection winding 18 causes small-magnitude horizontal-rate variations in deflection current 27. These variations tend to increase the vertical deflection current near the center of each horizontal scanning interval and decrease it near the beginning and end of each horizontal scanning interval near the top or bottom of the vertical scan, which can provide compensation of top-bottom pincushion distortion of a scanned raster in much the same manner as that of the aforementioned Haferl patent. Unlike the usual bow-tie shape of the top-bottom pincushion distortion waveform, the pincushion-correction portion of the voltage across the deflection winding may remain constant over the vertical scan, as illustrated by FIG. 2g.

At the end of the vertical scanning interval, conventional deflection current flows upwards through deflection winding 18. To initiate the vertical retrace at time T300, modulator 23 once again gates SCR 17 either late, or not at all during the respective horizontal intervals. Thus, the deflection current in deflection winding 18 and a small net charging current through inductor 16 and winding 8b charge due to conduction of SCR 13 charges capacitor 15 in a substantially resonant manner. The voltage across capacitor 15 rises sharply as illustrated by voltage waveform 26 as energy is transferred thereto, and the energy stored in winding 18 decreases to zero and then once again increases in a resonant manner preparatory for the next vertical scanning interval. Thus, a single winding 8b on flyback transformer 8 acts as a source of alternating voltage, and a single inductor 16 is coupled in series therewith. The series combination is gated during the horizontal trace and retrace intervals to provide alternating current for producing deflection current in winding 18. Since one SCR is gated during the trace interval and the other during the retrace interval, the gating pulses are at disparate times, thereby reducing the likelihood that stray coupling will materially affect or "pull" the SCR gating time to produce shading of the raster.

Figure 3:
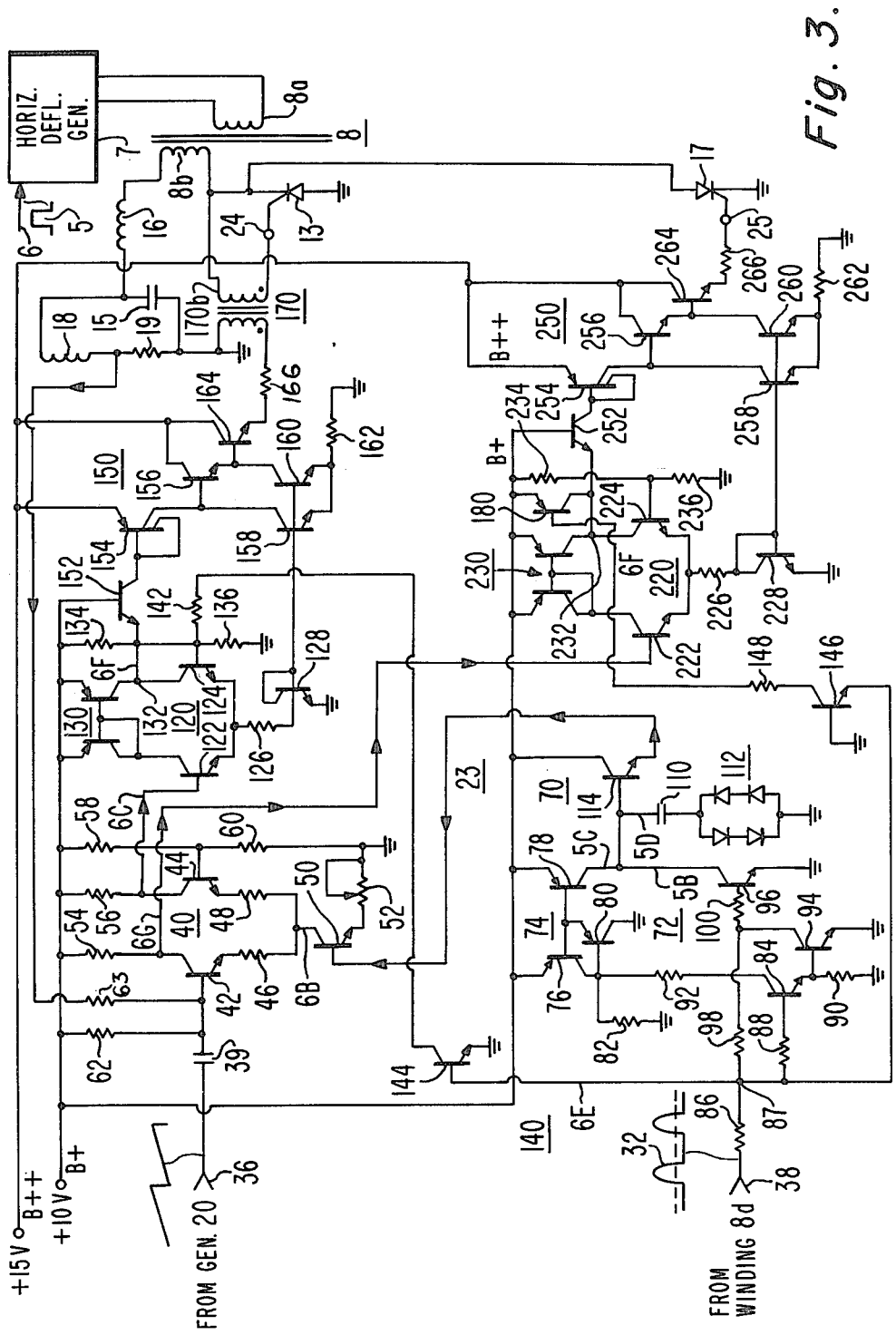
FIG. 3 illustrates in more detail the control circuit or modulator of FIG. 1.

FIG. 3 illustrates in schematic detail a modulator 23 suitable for use in the arrangement of FIG. 1. In modulator 23, generally, sawtooth signals 28 from sawtooth generator 20 are coupled by way of an input terminal 36 at upper left of FIG. 3 to a modulator 40, and horizontal retrace pulses 32 from winding 8d are coupled by way of an input terminal 38 at lower left of FIG. 3 to a sawtooth generator 70, which produces horizontal-rate sawtooth signals which are applied to modulator 40. Modulated signals are coupled from modulator 40 to a top-of-scan comparator 120 and to a bottom-of-scan comparator 220, each of which produces gating pulses during both the horizontal trace and retrace intervals. A blanking arrangement designated generally as 140 blanks the retrace interval gating pulses produced by top-of-scan modulator 120 and blanks the horizontal-trace interval gating pulses produced by bottom-of-scan modulator 220. The resulting horizontal trace and retrace gating pulses produced by modulators 120 and 220, respectively, are passed through inverting amplifiers 150 and 250, respectively, to form gating pulses 29 and 30 which are applied to the gates of SCRs 13 and 17. Resistor 63 provides inverse feedback.

Figure 5:
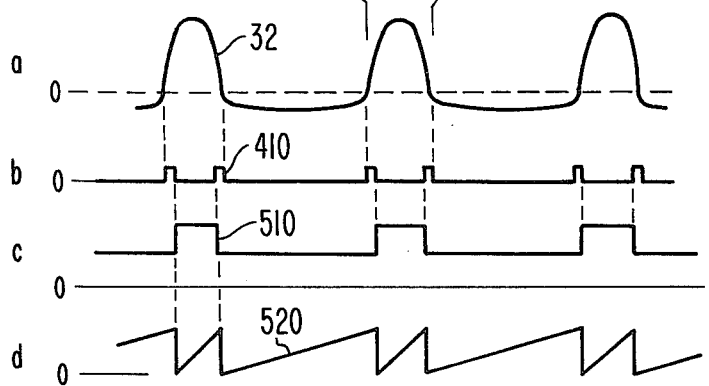

In FIG. 3, modulator 40 includes NPN transistors 42 and 44, the emitters of which are coupled together by a series combination of resistors 46 and 48. The junction of resistors 46 and 48 is coupled by a conductor 6B to the collector of an NPN current source transistor 50, the emitter of which is coupled to ground by an adjustable resistor 52. The collectors of transistors 42 and 44 are coupled to B+ by resistors 54 and 56, respectively. The base of transistor 44 is connected to a reference voltage established by a voltage divider including resistors 58 and 60 coupled between B+ and ground. The base of transistor 42 receives biasing current from B+ by a resistor 62, and receives vertical sawtooth signals from terminal 36 by way of capacitor 39. Sawtooth generator 70 includes a two-state current source designated generally as 72. Current source 72 includes a current mirror designated generally as 74 including NPN transistors 76 and 78, the emitters of which are coupled to B+ and the bases of which are coupled together. The collector of transistor 76 is connected to the base of a PNP transistor 80, the emitter of which is connected to the joined bases of transistors 76 and 78. The collector of transistor 80 is connected to ground. A resistor 82 connected between base of transistor 80 and ground provides a first magnitude of current to mirror 74, which is replicated on conductor 5c at the collector of transistor 78. Horizontal retrace pulses are coupled from input terminal 38 to the base of an NPN transistor 84 by way of resistor 86, junction 87 and resistor 88. The emitter of transistor 84 is coupled to ground by a resistor 90. The collector of transistor 84 is connected to the base of transistor 80 by a resistor 92. The base-emitter junction of an NPN transistor 94 is coupled across resistor 90. During the horizontal retrace pulse interval, transistor 84 conducts and produces an additional current through resistor 92 which adds to that produced by resistor 82 for producing an increased current on conductor 5c, as illustrated by waveform 510 of FIG. 5c.

Horizontal retrace pulses are coupled to the base of NPN transistor 96 from junction 87 by way of series connected resistors 98 and 100. The collector of transistor 94 is coupled to the junction of resistors 98 and 100. The collector 5b of transistor 96 is connected to conductor 5c, and both are connected to one end of a sawtooth capacitor 110. The other end of capacitor 110 is coupled to ground by two series pairs of antiparalleled diodes designated generally as 112.

Figure 4:
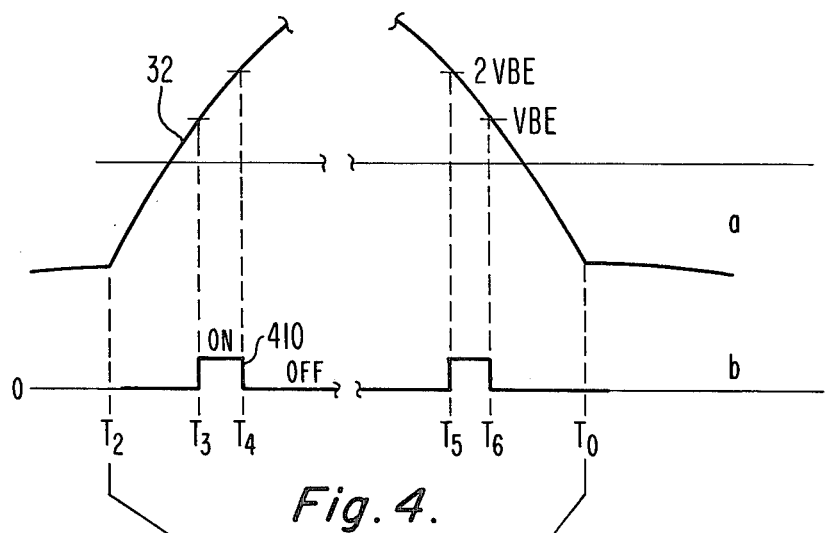
FIGS. 4–6 include logic diagrams and amplitude-time plots of certain voltage and current waveforms occurring in the arrangement of FIG. 3.

Transistor 96 is turned on for a short time near the beginning and the end of each horizontal retrace interval. As illustrated in FIG. 4a, horizontal retrace pulse voltage 32 passes through the 1 Vbe and 2 Vbe points near the beginning and end of each retrace interval. The increasing voltage near the beginning of the interval is applied to the base of transistor 96, and when 1 Vbe is reached at a time T3, transistor 96 becomes conductive, as illustrated by 410 of FIG. 4b in which a high level indicates conduction. The voltage applied to the base of transistor 96 continues to increase until the retrace voltage reaches 2 Vbe at a time T4, at which time transistors 84 and 94 become conductive, thereby depriving transistor 96 of base drive and returning transistor 96 to the nonconductive state, represented in FIG. 4b as a zero level. The nonconductive state continues until the later interval T5–T6 in which the retrace voltage pulse is again between 1 Vbe and 2 Vbe near the end of the retrace intervals. Thereafter, and during the trace interval after time T0, transistor 96 remains nonconductive. Thus, transistor 96 is conductive to discharge sawtooth capacitor 110 near the beginning and end of each horizontal retrace interval. During those intervals in which transistor 96 is nonconductive, capacitor 110 is charged from dual-mode current source 72. As mentioned in conjunction with FIG. 5c, the current produced by current source 72 is greater during the horizontal retrace interval than during the horizontal trace interval. Consequently, the sawtooth voltage generated across capacitor 110 has the appearance of waveform 520 of FIG. 5d.

Sawtooth voltage waveform 520 is coupled to the base of transistor 50 by the base-emitter junction of a transistor 114 to vary the current flowing in modulator 40 and to modulate the vertical-rate sawtooth signal at the collectors of transistors 42 and 44. Vertical-rate sawtooth input signal 28 varies relatively little during each horizontal interval. Its influence on the output signals 610 and 650 of modulator 40 is represented by a sloping change in the level of the horizontal-rate sawtooth signal, as illustrated by voltage waveforms 610 and 650 of FIGS. 6c and 6g, respectively. Modulated sawtooth signal 610 is applied over conductor 6c to the base of an NPN transistor 122 of comparator 120. Transistor 122 is emitter-coupled with an NPN transistor 124, and the joined emitters are coupled to ground through a resistor 126 and a diode-connected transistor 128. The collector of transistor 122 is coupled to the collector of transistor 124 by a current mirror designated generally as 130 which is used as a push-pull to single-ended converter to form an output terminal 132 of comparator 120. The base of transistor 124 is coupled to a reference voltage generated at the tap of a voltage divider including resistors 134 and 136 coupled between B+ and ground. Modulator 120 responds to sawtooth signal 610 and attempts to produce a negative output pulse at terminal 132 each time signal 610 exceeds the reference voltage at the base of transistor 124. The unblanked output signal of comparator 120 is illustrated by waveform 620 of FIG. 6d.

The base of transistor 124 is coupled to ground by a resistor 142 and the main collector-emitter conductive path of a switch transistor 144 of a blanking arrangement designated generally as 140. The base of transistor 144 is coupled to junction 87. Transistor 144 becomes conductive whenever the portion of retrace pulse 32 applied to its base exceeds 1 Vbe, which occurs during substantially the entire retrace interval. Thus, transistor 144 is conductive during the horizontal retrace interval as illustrated by logic signal 630 of FIG. 6e. A high level of signal 630 represents a conductive condition of transistor 144. During the interval in which transistor 144 is conductive, the reference voltage at the base of transistor 124 is reduced and comparator 120 produces a high output, regardless of the condition of signal 610. The blanked output signal of comparator 120 resulting from the combination of blanking signal 630 and the basic response of comparator 120 to waveform 610 is illustrated by voltage waveform 640 of FIG. 6f, which is the inverse of desired gating signal 29.

Waveform 640 is coupled from terminal 132 over a conductor 6F to the emitter of an NPN transistor 152 of an inverting output amplifier 150. The collector of transistor 152 is coupled to the base of a PNP transistor 154, the emitter of which is coupled to a source B++ of a voltage more positive than B+. Transistor 154 has two collectors, one of which is coupled to its base and the other of which is coupled to the base of an NPN transistor 156 and to the collector of an NPN transistor 158. The base of transistor 158 is coupled to the base of transistor 128 and to the base of an NPN transistor 160. The emitter of transistor 160 is coupled to the emitter of transistor 158, and its collector is coupled to the emitter of transistor 156. The joined emitters of transistors 158 and 160 are coupled to ground by means of a resistor 162. The base of a transistor 164 is coupled to the emitter of transistor 156. The collector of transistor 164 is connected to the collector of transistor 156 and to B++. Output signal 29 is taken from inverting amplifier 150 by means of a resistor 166 connected to the emitter of transistor 164. The other end of resistor 166 drives the primary of a pulse transformer 170, a secondary winding 170b of which is coupled across the gate-cathode junction of SCR 13.

Modulated sawtooth signal 650 at output 6G of modulator 40 drives a comparator designated generally as 220 which is similar to comparator 120. Elements of comparator 220 corresponding to those of comparator 120 are designated by the same reference numeral, in the 200 series. Comparator 220 differs from comparator 120 only in the blanking arrangement. The response produced by comparator 220 at output terminal 232 in response to modulated sawtooth signal 650 in the absence of blanking is illustrated by signal 660 of FIG. 6h. Trace blanking is accomplished by a PNP transistor 180 having its emitter coupled to B+ and its collector coupled to comparator output terminal 232. The base of transistor 180 is coupled through a resistor 148 to the collector of an NPN transistor 146 of blanking circuit 140. The base of transistor 146 is coupled to ground and the emitter is connected to junction 87. During the horizontal trace interval, signal 32 is negative with respect to ground, thereby rendering transistors 146 and 180 conductive. The effect of trace blanking is to raise the voltage at terminal 232 to B+ during the trace interval, as illustrated by waveform 670 of FIG. 6i. The combination of blanking and the response of comparator 220 to waveform 650 is illustrated by waveform 680 of FIG. 6j, which is the inverse of desired gating signal 30. The output of comparator 220 is applied through an inverting output amplifier 250 corresponding to amplifier 150 to the gate of SCR 17. Since the cathode of SCR 17 is grounded, there is no need for a transformer to isolate the drive circuits from the SCR.

Figure 6:
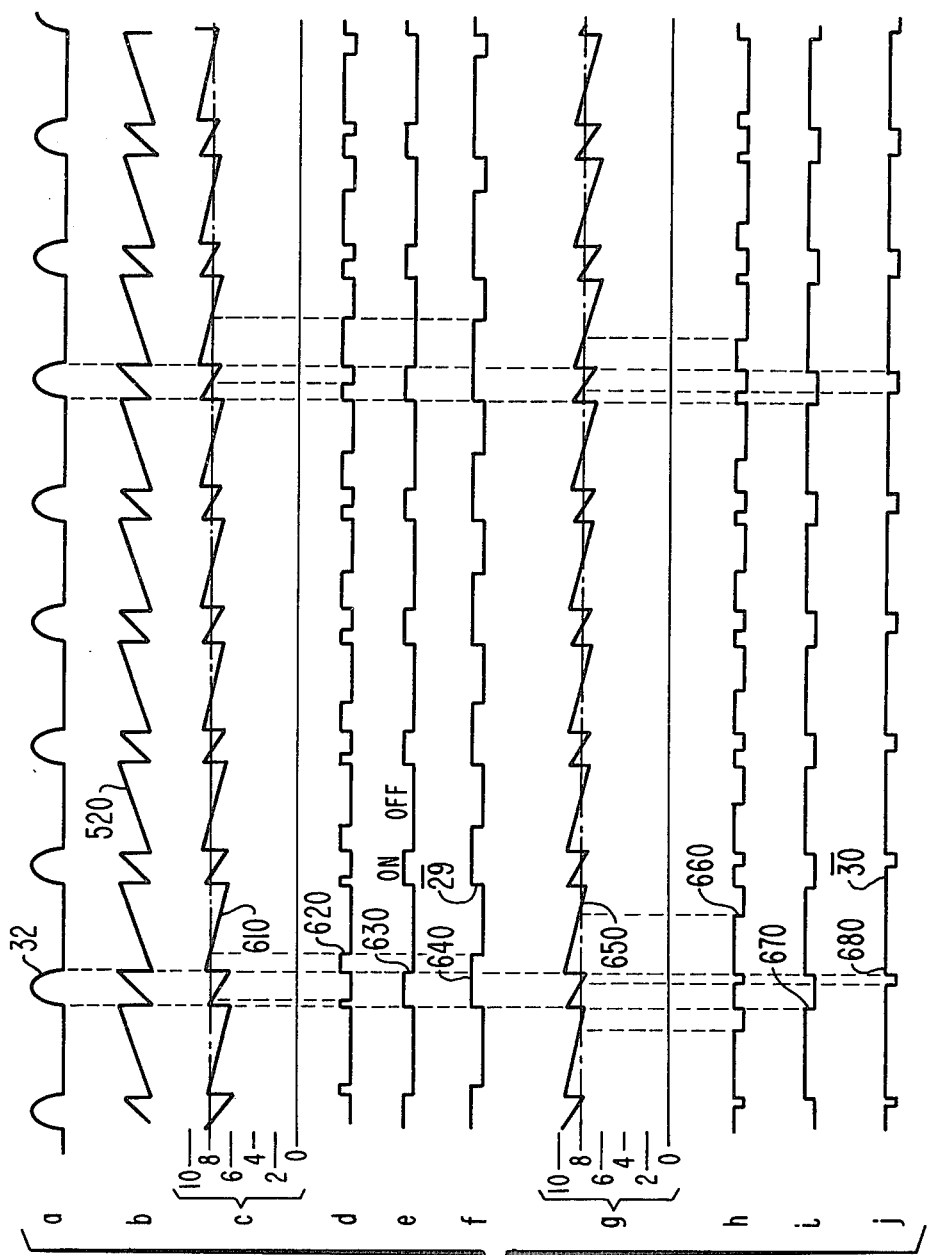

Examination of waveforms of FIG. 6 shows that modulated sawtooth 610 gives rise to pairs of negative-going pulses 620 each of which ends at the beginning or end of each horizontal retrace interval and the duration of which decreases progressively during the vertical scanning interval. The retrace portion is blanked out to produce pulses which when inverted produce positive-going pulses 29 which terminate at the beginning of the retrace interval and which become progressively longer in duration during the vertical scanning interval. Similarly, waveform 650 gives rise to pairs of negative-going pulses 660 which become progesssively longer in duration and which when blanked and inverted produce positive-going pulses 30 terminating at the end of the horizontal retrace interval and which are initiated progressively earlier during the vertical scanning interval.

Figure 7:
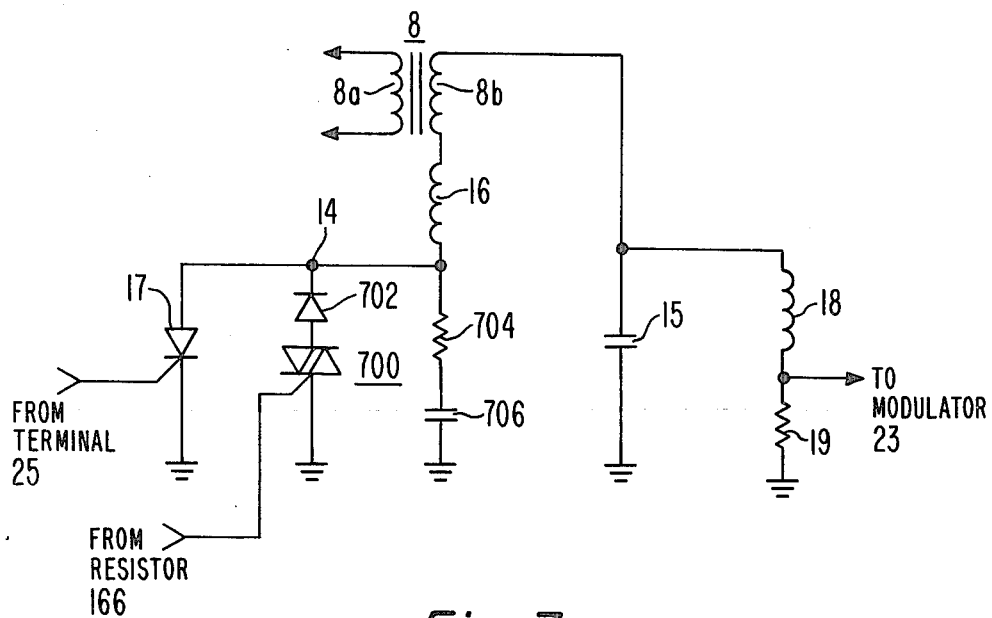
FIGS. 7, 8 and 9 are schematic diagrams illustrating alternate embodiments of the invention.

FIG. 7 illustrates the use of a triac in place of SCR 13. This arrangement provides the advantage of eliminating the necessity for a pulse transformer such as 170 of FIG. 3. In FIG. 7, elements corresponding to those of FIG. 1 have the same reference number. In FIG. 7, the main current conducting path of a gate-controllable full-wave AC silicon switch thyristor or triac 700 has one end connected to ground and the other end connected to the anode of a diode 702. The cathode of diode 702 is connected to junction 14 of inductor 16 and SCR 17. When gated into conduction, control of the conduction of triac 700 by the gate ends. Thus, turn-off of the thyristor cannot occur until current stops flowing therethrough. Commercially available triacs have turn-on times compatible with operation during the horizontal retrace interval. During the turn-off interval of triac 700, which occurs during the horizontal retrace interval as described, the change in voltage across the triac may occur more quickly than the triac can follow. Thus, the triac may not turn off at the time the current in the charging path of capacitor 15 decreases to zero. Instead, thyristor 13 may continue to conduct, and that conduction would be in the same direction as that intended to be controlled by SCR 17. This might perturb the operation of the SSVD system. Diode 702 prevents current flow in the path through triac 700 after the current therethrough decreases to zero, even though the triac continues to be conductive for the portion of the remaining horizontal trace interval. Reliability of the operation of the arrangement of FIG. 7 is enhanced by a snubbing network including the series combination of a resistor 704 and a capacitor 706 coupled between junction 14 and ground for reducing the maximum rate of voltage rise across the thyristors.

Figure 8:
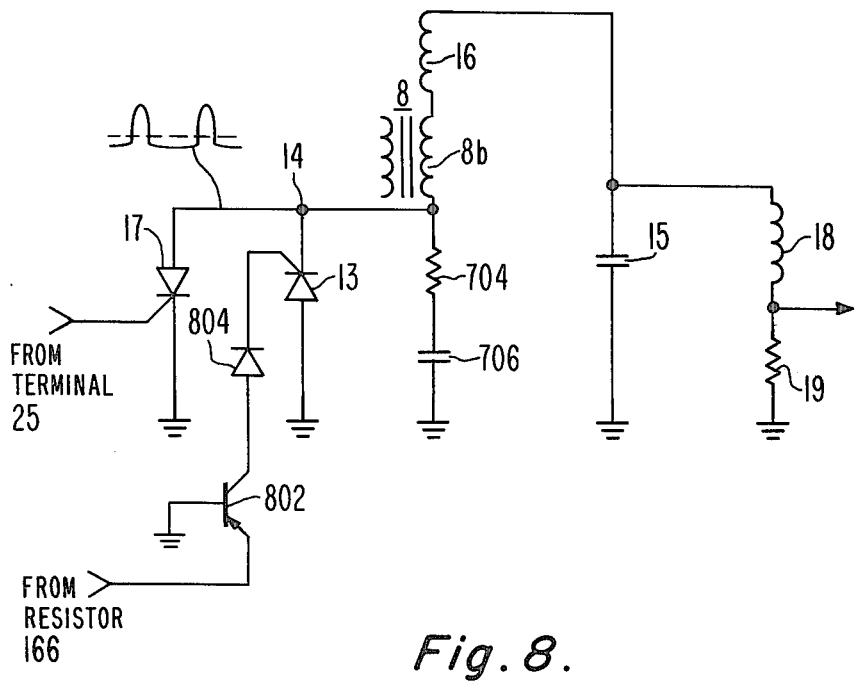

FIG. 8 illustrates another arrangement by which a control circuit may drive the thyristor switches without the need for an isolating transformer. In FIG. 8, those elements corresponding to elements previously described have the same reference number. In FIG. 8, the gate of SCR 13 is coupled to the cathode of a diode 804, the anode of which is coupled to the collector of a PNP transistor 802. The base of transistor 802 is coupled to ground and the emitter is driven directly from resistor 166 of FIG. 3. During the horizontal retrace interval, circuit point 14 is positive with respect to ground, SCR 17 is forward biased and can be gated by positive pulses from terminal 25 as described. During this same horizontal retrace interval, no current can flow through the gate of SCR 13 because diode 804 is reverse-biased. During the horizontal trace interval, however, circuit point 14 is negative with respect to ground, SCR 17 is reverse-biased and SCR 13 is forward-biased. So long as transistor 802 is nonconductive, no gate drive can flow through diode 804 and the cathode-gate junction of SCR 13 to trigger SCR 13. Application of a positive pulse with respect to ground to the emitter of transistor 802 forward-biases the base-emitter junction of transistor 802, allowing substantially all the emitter current to flow through diode 804 and the cathode-gate junction of SCR 13 to gate SCR 13 into conduction. Thus, in the arrangement of FIG. 8 recognition is taken of the fact that a positive drive with respect to ground can be made to flow through the gate junction of SCR 13 due to the negative voltage at circuit point 14 during the horizontal trace interval.

Other embodiments of the invention will be obvious to those skilled in the art. For example, transistors suitably biased may be used as electronic switches in place of the described thyristors. Inductor 16 may be serially coupled between winding 8b and capacitor 15, as illustrated in FIG. 8. Separate inductors may be serially coupled with SCRs 13 and 17 rather than being combined into a single inductor 16. The thyristors may be gated into conduction during every horizontal interval during the vertical scanning interval, as shown, (full overlap operation) or may be paritally overlapped, i.e., gated into conduction during horizontal intervals occurring during more than half of the vertical scanning interval but less than the entire vertical scanning interval, or may be operated in a nonoverlapping manner, i.e., during half the vertical scanning interval. Similarly, during the vertical retrace interval both thyristors may be turned OFF to allow a purely resonant retrace, or vestigial gating of SCR 17 may continue during the vertical retrace interval. Also, SCR 13 may be driven to maximum conduction during the retrace interval to increase the energy stored in the system during retrace.

Figure 9:
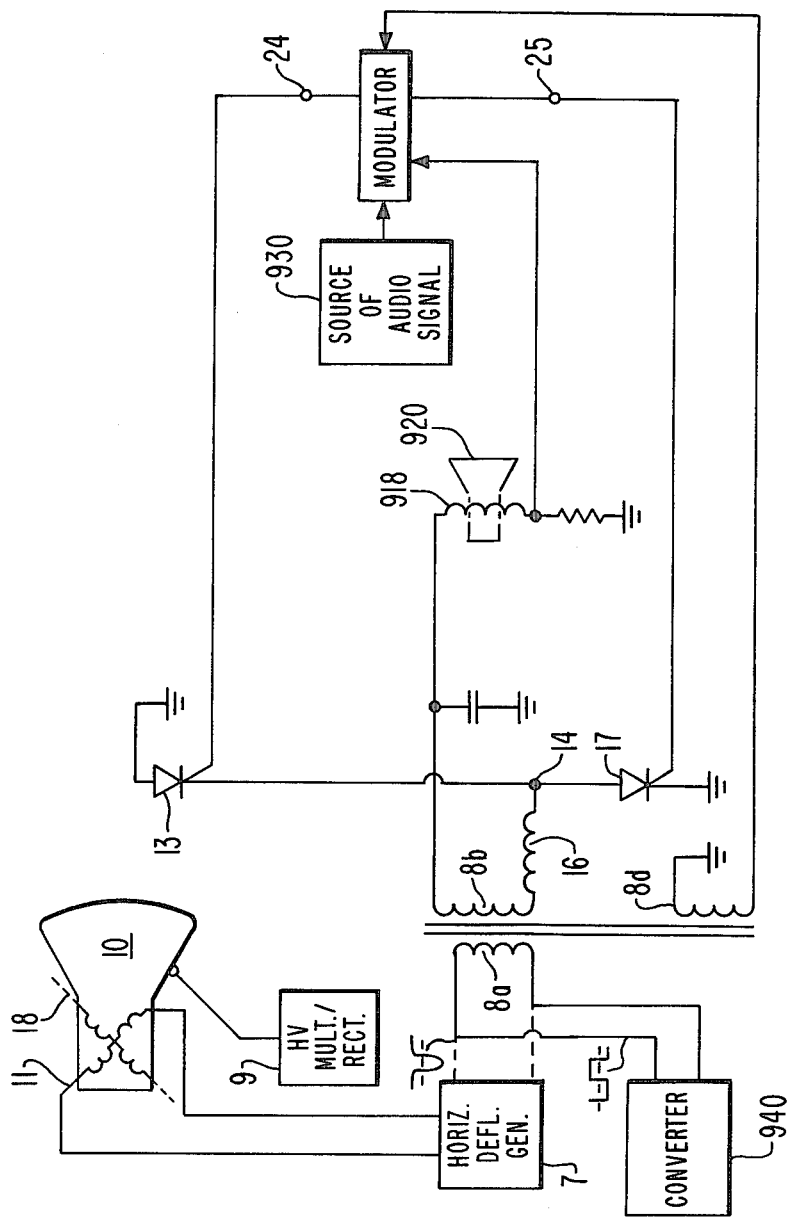

Other applications of the principles of the invention are possible. For example, considering that the described arrangement is a power amplifier energized from an alternating-current source, simply replacing deflection winding 18 of FIG. 1 by the coil 918 of a loudspeaker 920 and vertical sawtooth generator 20 by an audio source 930 as illustrated in FIG. 9 allows the invention to be applied as a power-efficient power audio amplifier energized directly from the horizontal deflection. Energizing such an audio amplifier from square waves produced by a higher-frequency (50 kHz) converter 940 rather than from the horizontal deflection as illustrated in FIG. 9 reduces audio distortion resulting from a horizontal sampling frequency. Similarly, a converter could be used to energize a power amplifier for producing vertical deflection by substituting converter 940 for horizontal deflection generator 7 of FIG. 1 as illustrated in phantom lines in FIG. 1.

What is claimed is:

1. A deflection system for a cathode-ray tube, said deflection system comprising:
   a horizontal deflection circuit for deflecting an electron beam of said tube in horizontal directions during alternate horizontal trace and retrace intervals in response to a recurrent deflection signal;
   a vertical deflection winding responsive to a recurrent sawtooth current therethrough for deflecting said beam in a vertical direction; and
   switched vertical deflection means for applying successively smaller portions of the energy of said deflection signal to said vertical deflection winding during a first interval of the recurrent vertical deflection cycle and successively greater portions of said energy of said deflection signal during a second interval of said recurrent vertical deflection cycle for producing said sawtooth current, said first and second intervals both occurring during the trace interval of said vertical deflection cycle, one of said first and second intervals occurring during said horizontal retrace intervals and the other of said first and second intervals occurring during said horizontal trace intervals.

2. A system according to claim 1, wherein said switched vertical deflection means comprises:
   coupling means coupled to said horizontal deflection generator for coupling energy therefrom and for generating a voltage alternating at the rate of said recurrent deflection signal;
   controllable switch means coupled to said coupling means and to said vertical deflection winding for applying said alternating voltage to said vertical deflection winding during those intervals in which said controllable switch means is conductive; and
   switch control means coupled to said controllable switch means for controlling said switches in such a manner as to generate said recurrent sawtooth current.

3. A system according to claim 2, wherein said coupling means comprises a transformer, a primary winding of which is coupled with said horizontal deflection generator and a secondary winding of which is coupled with said controllable switch means.

4. A system according to claim 2, wherein said controllable switch means comprises first and second electronic switches, said first electronic switch being coupled with said coupling means and with said vertical deflection winding for allowing the flow of current from said coupling means to said deflection winding during one of said trace and retrace intervals, said second electronic switch being coupled with said coupling means and said deflection winding for allowing the flow of current from said coupling means to said deflection winding during the other of said trace and retrace intervals.

5. A system according to claim 4, wherein said electronic switches comprise thyristors.

6. A system according to claim 4, wherein said coupling means comprises a transformer, a primary winding of which is coupled with said horizontal deflection generator and a secondary of which is coupled with said electronic switches.

7. A system according to claim 6, wherein said first and second electronic switches comprise first and second antiparalleled thyristors.

8. A system according to claim 6, wherein said electronic switches are coupled to form a parallel combination, and said parallel combination is serially coupled with said secondary winding and said deflection winding to form a series combination.

9. A system according to claim 8, further comprising an inductor serially coupled with said series combination to form a closed path for the flow of current pulses in response to conduction of said electronic switches.

10. A system according to claim 9, further comprising a capacitor coupled in parallel with said deflection winding for integrating said current pulses to form a drive voltage across said deflection winding, which drive voltage fluctuates in a manner providing pincushion correction.

11. A method for producing vertical deflection current through a vertical deflection winding of a television apparatus, comprising the recurrent steps of:
   extracting energy from the horizontal deflection circuit during one of the horizontal trace and retrace intervals;
   applying said energy so extracted to said vertical deflection winding for promoting deflection current therein in a first polarity;
   extracting energy from said horizontal deflection circuit during the other of said horizontal trace and retrace intervals;
   applying said energy extracted during the other of said intervals to said vertical deflection winding poled to promote said deflection current in a second polarity opposite to said first; and
   changing the energy so extracted during each successive recurrent cycle to vary said deflection currents of said first and second polarities so as to form the desired vertical deflection current.

12. A switched vertical deflection arrangement, comprising:
   a source of voltage alternating at the horizontal rate between mutually opposite first and second polarities;
   a vertical deflection winding;
   first controllable switch means coupling said source with said winding during the horizontal retrace interval for allowing the flow of current of a first polarity through said winding;
   second controllable switch means coupling said source with said winding during the horizontal trace interval for allowing the flow of current through said winding of a second polarity opposite said first; and
   control means coupled with said first and second switches for controlling the conduction thereof for controlling the amount of current of said first and second polarities flowing in said winding for control of the net current therethrough to establish the vertical deflection current.

13. An improved switched vertical deflection circuit which couples samples of horizontal deflection energy to a vertical deflection winding during recurrent sampling intervals, for promoting vertical deflection current in said vertical deflection winding, wherein the improvement lies in that said recurrent sampling intervals alternate between the horizontal trace and retrace intervals.

14. A power amplifier arranged to be energized from a horizontal deflection circuit comprising:
   a horizontal deflection circuit for deflecting an electron beam of a kinescope during alternate horizontal trace and retrace intervals in response to a recurrent deflection signal;
   a load;
   first and second controllable switch means coupled to said deflection circuit and to said load for controllably applying portions of the energy of said deflection signal to said load during each of said trace and retrace intervals;
   a source of signals which are to be amplified; and
   control means coupled to said source and to said controllable switch means for controlling said switch means in such a manner as to apply said portions of the energy of said deflection signal to said load for producing across said load a replica of said signals which are to be amplified.

15. An amplifier according to claim 14 wherein said portions of said energy coupled to said load during said trace and retrace intervals are represented by currents having mutually opposite polarities during said trace and retrace intervals.

16. An amplifier according to claim 14 wherein said control means is further coupled with said load for feedback control of the accuracy of said replica.

17. A deflection system for a cathode-ray tube, said deflection system comprising:
   a horizontal deflection system coupled to a horizontal deflection winding for producing a horizontal deflection signal thereacross;
   a source of voltage independent of said horizontal deflection system, said source producing alternating voltage of first and second mutually opposite polarities during first and second intervals, respectively, said first and second intervals recurring cyclically;
   a vertical deflection winding;
   switched vertical deflection means coupled with said source and with said vertical deflection winding for applying progressively smaller portions of the energy produced by said source during said recurrent first intervals to said vertical deflection winding and progressively larger portions of the energy produced by said source during said recurrent second intervals for generating each sawtooth vertical deflection current in said vertical deflection winding.

* * * * *